United States Patent [19]
Lee et al.

[11] Patent Number: 5,558,736
[45] Date of Patent: Sep. 24, 1996

[54] ELECTRON CYCLOTRON RESONANCE APPARATUS

[75] Inventors: Sang Y. Lee; Roh Y. Sung; Cheong D. Lee; Dae H. Kim, all of Ichonkun, Rep. of Korea

[73] Assignee: Hyundai Electronics Industries Co., Ltd., Rep. of Korea

[21] Appl. No.: 192,403

[22] Filed: Feb. 4, 1994

[30]  Foreign Application Priority Data

Feb. 6, 1993 [KR] Rep. of Korea ............... 1993-1637

[51] Int. Cl.⁶ ............................................ H05H 13/00
[52] U.S. Cl. ............... 156/345; 118/724; 118/723 MA; 118/723 MR
[58] Field of Search ................... 156/345, 643; 118/724, 723 MA, 723 MR; 204/298.38, 298.37, 298.15, 298.09

[56]  References Cited

U.S. PATENT DOCUMENTS

| | | | |
|---|---|---|---|
| 4,842,683 | 6/1989 | Cheng et al. | 156/345 |
| 4,949,783 | 8/1990 | Lakios et al. | 118/724 X |
| 4,999,320 | 3/1991 | Douglas | 156/345 X |
| 5,078,851 | 1/1992 | Nishihata et al. | 156/345 X |
| 5,096,536 | 3/1992 | Cathey, Jr. | 156/724 X |
| 5,238,499 | 8/1993 | van de Ven et al. | 156/345 X |
| 5,275,683 | 1/1994 | Arami et al. | 156/345 |
| 5,320,982 | 6/1994 | Tsubone et al. | 156/345 X |
| 5,342,471 | 8/1994 | Fukasawa et al. | 156/345 |

Primary Examiner—Thi Dang
Attorney, Agent, or Firm—Merchant, Gould, Smith, Edell, Welter & Schmidt

[57]  ABSTRACT

An electron cyclotron resonance apparatus capable of achieving a cryogenic cooling effect. By a radioactive motion property of radicals, a side wall etch of a photoresist can be avoided in fabrication of next generation integrated micropatterns. The apparatus also eliminates conflicting increase/decrease phenomenons occurring between the etch rate and the anisotropy and between the etch rate and the uniformity in general etching equipments. This achieves not only a desired vertical etch, but also a rapid etch rate. As a result, it is possible to eliminate factors of causing a complexity in the process using a conventional triple-layer photoresist (TLR) or multilayer photoresist (MTR) and degrading the yield and the productivity.

10 Claims, 6 Drawing Sheets

ELECTRON CYCLOTRON RESONANCE APPARATUS

BACKGROUND OF THE INVENTION

1. Field of the Invention

The present invention relates to an electron cyclotron resonance (ECR) apparatus used in etching and depositing steps in fabrication of a highly integrated semiconductor device, and more particularly to an ECR apparatus capable of achieving a cryogenic cooling effect.

2. Description of the Prior Art

Generally, ECR etching equipments utilizing plasma have a construction for receiving a substrate (wafer) in the process of fabrication of semi conductor devices, controlling parameters such as temperature and radio frequency required in an etching step so that the wafer can properly match to the etching step, and uniformly dropping ions and radicals participating in practical process steps so that they can react with desired targets to be processed. Such a construction involves important factors determining the superiority of etching equipments and affects considerably results of process steps. In particular, parameters determining etching rate, selectivity, anisotropy and uniformity, all of which are indicative of characteristics of etching equipments, are mainly affected by an electrode.

The electrode is a part having a close relationship with the carriage of the wafer. Accordingly, the electrode should be designed so as to safely seat the wafer thereon.

Processes for etching semiconductor elements are classified into a wet etching process using an acid and a dry etching process using plasma. For fabricating gates and trenches having microstructures, the dry etching process is used which provides a high anisotropy and a uniformity in etching rate and achieves a selective etch. As such a dry etching process, there have been known an ECR microwave plasma etching process and a reactive ion etching (RIE) process.

To achieve a high anisotropic etch at a high etch rate means that a conflicting increase/decrease effect present between the etching rate and the side wall etching is eliminated. The RIE process using radio frequency is adapted to achieve an anisotropic etch by utilizing a directional energy included in ions. When ions having an energy of a certain level strike against a substrate (wafer), a crystalline defect may occur at a film formed on the wafer or the wafer itself. When the ion energy is high, therefore, it is essentially required to mix a certain gas with the ions so as to reduce an undercut phenomenon occurring in the reactive ion etching.

In the RIE process, however, sufficiently high etch rate and selectivity can not be obtained. Furthermore, the RIE process requires an additional gas injection for a formation of a side wall protective film. As a result, the RIE process has problems of a complicated process, an increased wafer contamination, a degraded electrical characteristic of a device finally fabricated, and a decreased yield.

On the other hand, the ECR microwave plasma etching process has been developed to overcome the limitation of the above-mentioned RIE process. The ECR microwave plasma etching process generates a reduced contamination and a reduced crystalline defect because it is carried out under a pressure lower than that used in the RIE process.

Even in the ECR microwave plasma etching process, however, it is impossible to individually control the side wall etching and the substrate etching. Furthermore, a conflicting increase/decrease phenomenon typically present between the anisotropic etching and the etch selectivity occurs in both the RIE process and the ECR microwave plasma etching process.

SUMMARY OF THE INVENTION

Therefore, an object of the invention is to solve the above-mentioned problems encountered in the prior arts and to provide an ECR apparatus capable of cryogenically lowering the temperature of a wafer, thereby eliminating a conflicting increase/decrease phenomenon occurring between an anisotropic etching and an etch selectivity.

In accordance with the present invention, this object can be accomplished by providing an electron cyclotron resonance apparatus comprising: a wafer pedestal for supporting a wafer such that said wafer can be treated and absorbing heat from the wafer to cool the wafer, said wafer pedestal being connected with a radio frequency terminal and provided with means for injecting a heat transfer gas into a region defined beneath the wafer, thereby lowering a temperature of the wafer and a refrigerant pipe for feeding a refrigerant; lifting means for vertically listing the wafer laid on the wafer pedestal and for laying the wafer on the wafer pedestal; insulating members for insulating a side surface and a lower surface of the wafer pedestal to which a radio frequency from said radio frequency terminal is applied; a heat transfer gas tube extending through one of said insulating members which is in contact with said lower surface of the wafer, said heat transfer gas tube is adapted to inject a heat transfer gas into a region defined beneath the wafer pedestal; a refrigerant tube for guiding a refrigerant which circulates in the interior of the wafer pedestal to cool the wafer pedestal; and a vacuum channel and a pumping line both for exhausting a gas reacted with the wafer by a pumping action.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1 to 6, there is illustrated an ECR apparatus in accordance with the present invention.

Figure 1:
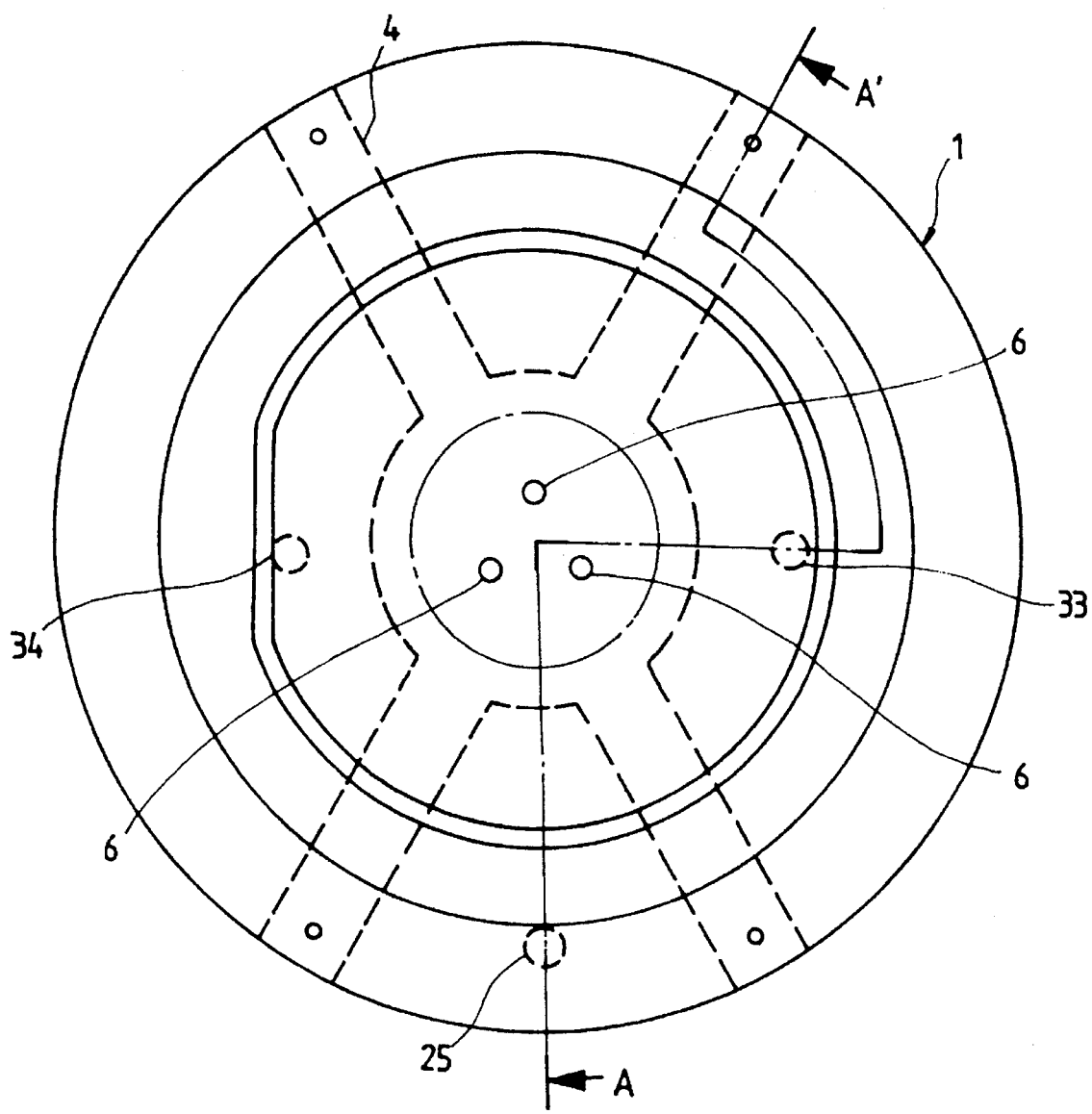
FIG. 1 is a plan view of an ECR apparatus, showing a wafer pedestal which constitutes a part of the ECR apparatus.
Figure 4:
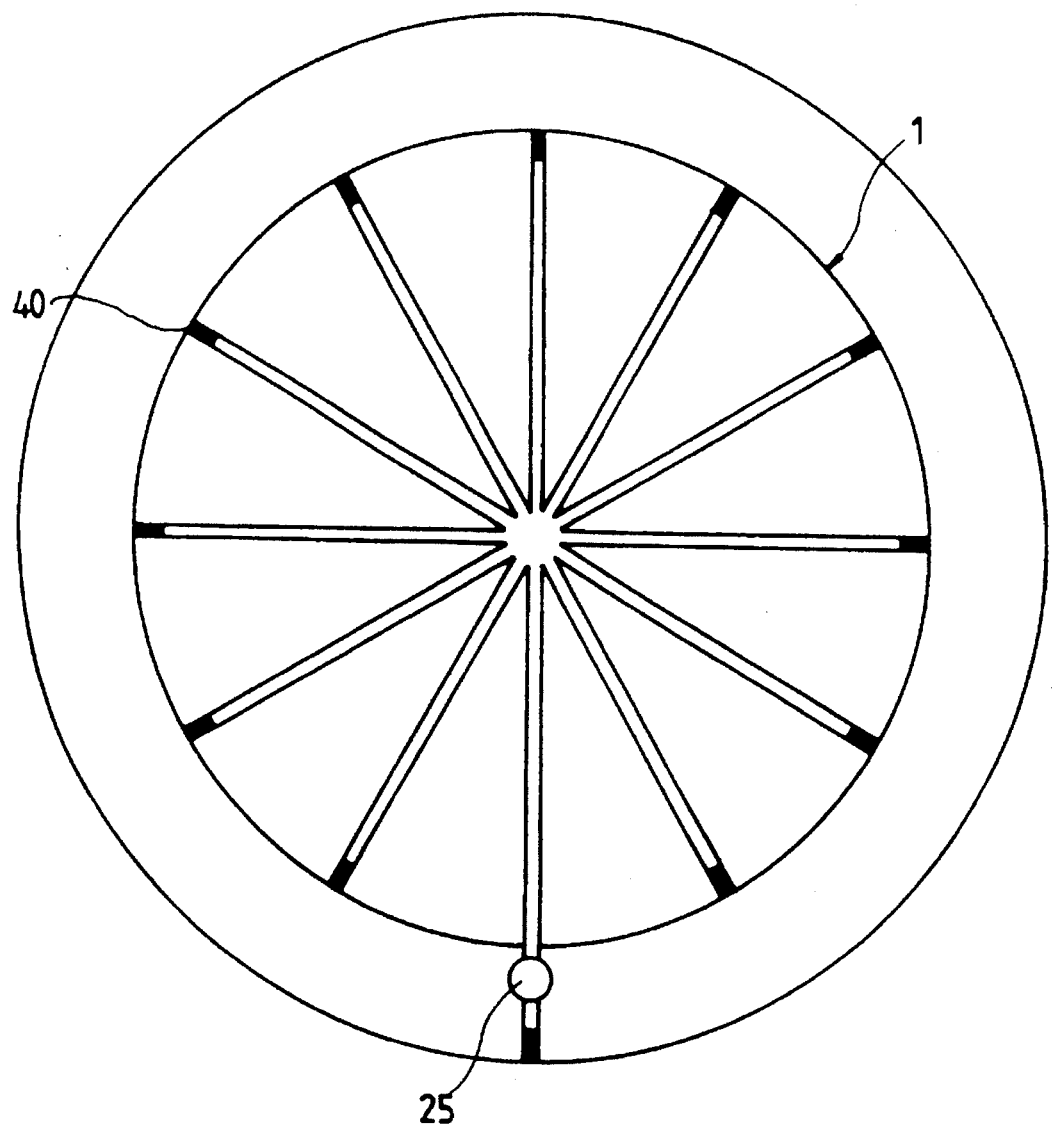
FIG. 4 is a cross-sectional view taken along the line B—B' of FIG. 3A.
Figure 5:
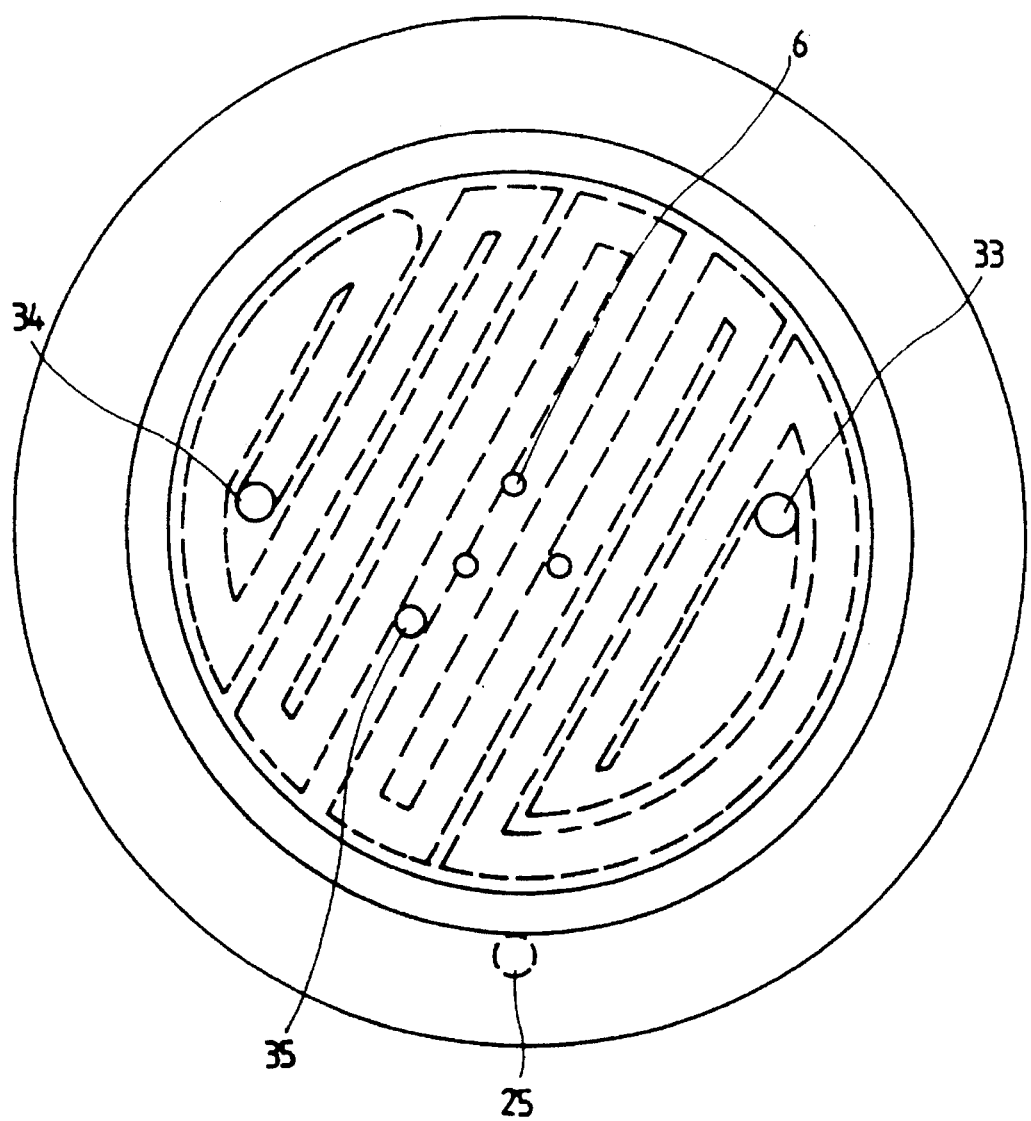
FIG. 5 is a plan view of the wafer pedestal of FIG. 1, showing a refrigerant line provided in the wafer pedestal.

FIG. 1 is a plan view of a wafer pedestal which constitutes a part of the ECR apparatus. Although the wafer pedestal which is denoted by the reference numeral 1 has the same shape as those of conventional wafer pedestals, it has a different construction from those of the conventional wafer pedestals. In other words, the wafer pedestal 1 has a helium line and a refrigerant line so as to improve an anisotropic etch and a uniformity in etching. The wafer pedestal 1 has a helium inlet 25 connected to the helium line which is radially arranged, as shown in FIG. 4. With this construction, helium from the helium inlet 25 flows along the lower surface of the wafer pedestal 1 through the helium line, thereby causing the wafer pedestal 1 to be cooled. On the other hand, the wafer pedestal 1 has a refrigerant inlet 33 and a refrigerant outlet 34 between which the refrigerant line is connected, as shown in FIG. 5. As a refrigerant such as a cooling water is introduced in the refrigerant line through the refrigerant inlet 33 and then discharged from the refrigerant line through the refrigerant outlet 34, the temperature of the wafer pedestal 1 increased by hot plasma is reduced. In other words, the refrigerant absorbs a heat transferred from a wafer to the wafer pedestal 1 via the helium circulating in the wafer pedestal 1.

The ECR apparatus comprises a lifting pin 6 for laying a wafer fed from a wafer feeding device on the wafer pedestal 1 so as to treat the wafer and lifting the treated wafer from the wafer pedestal 1 so as to move the wafer to another wafer feeding device by a wafer arm. The ECR apparatus further comprises a four-leg lifter 4 for vertically moving clamps 7 adapted to firmly hold the wafer at a desired position. The operation of the clamps 7 and the four-leg lifter 4 will be described in detail in conjunction with FIG. 2.

Figure 2:
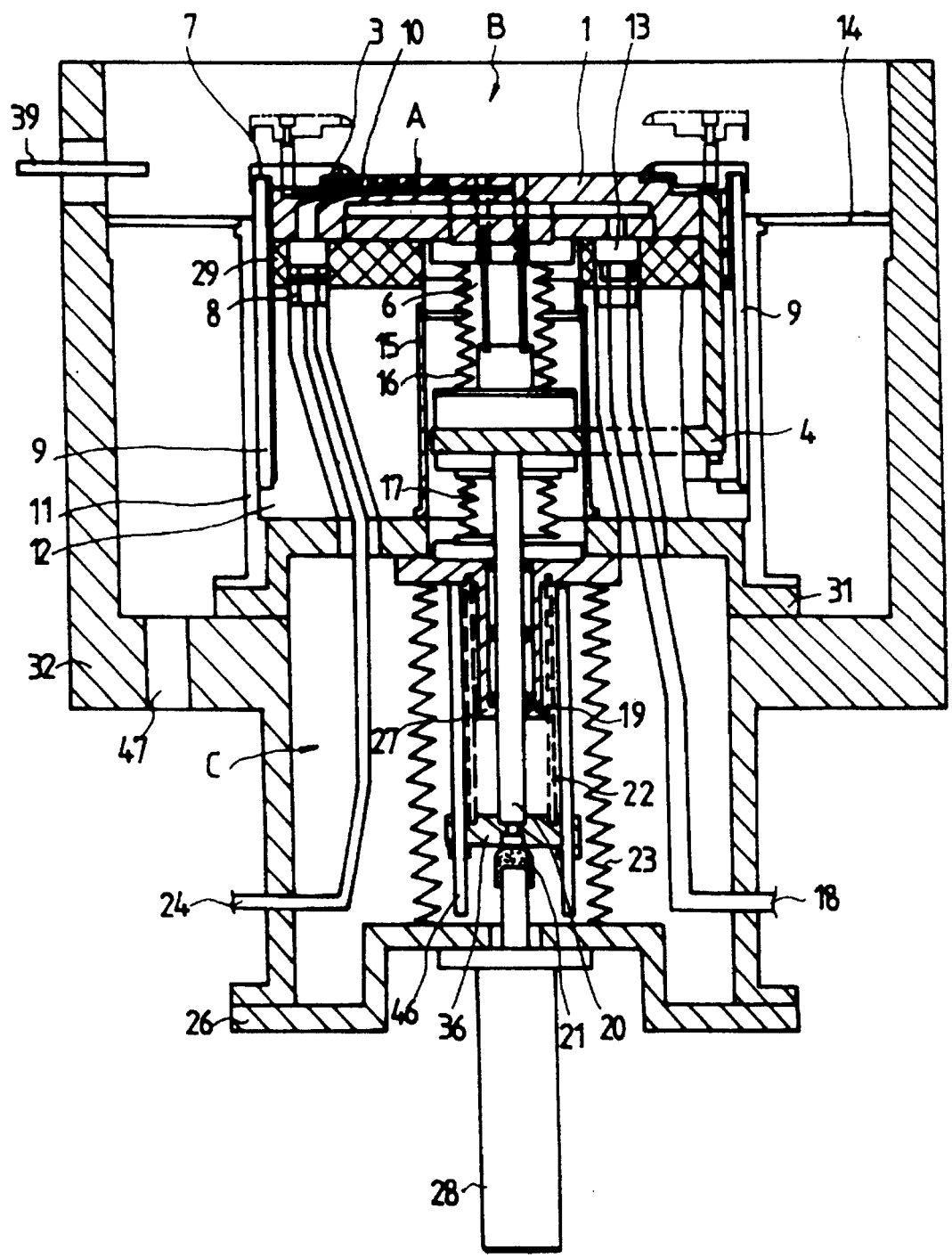
FIG. 2 is a cross-sectional view taken along the line A—A' of FIG. 1.
Figure 3:
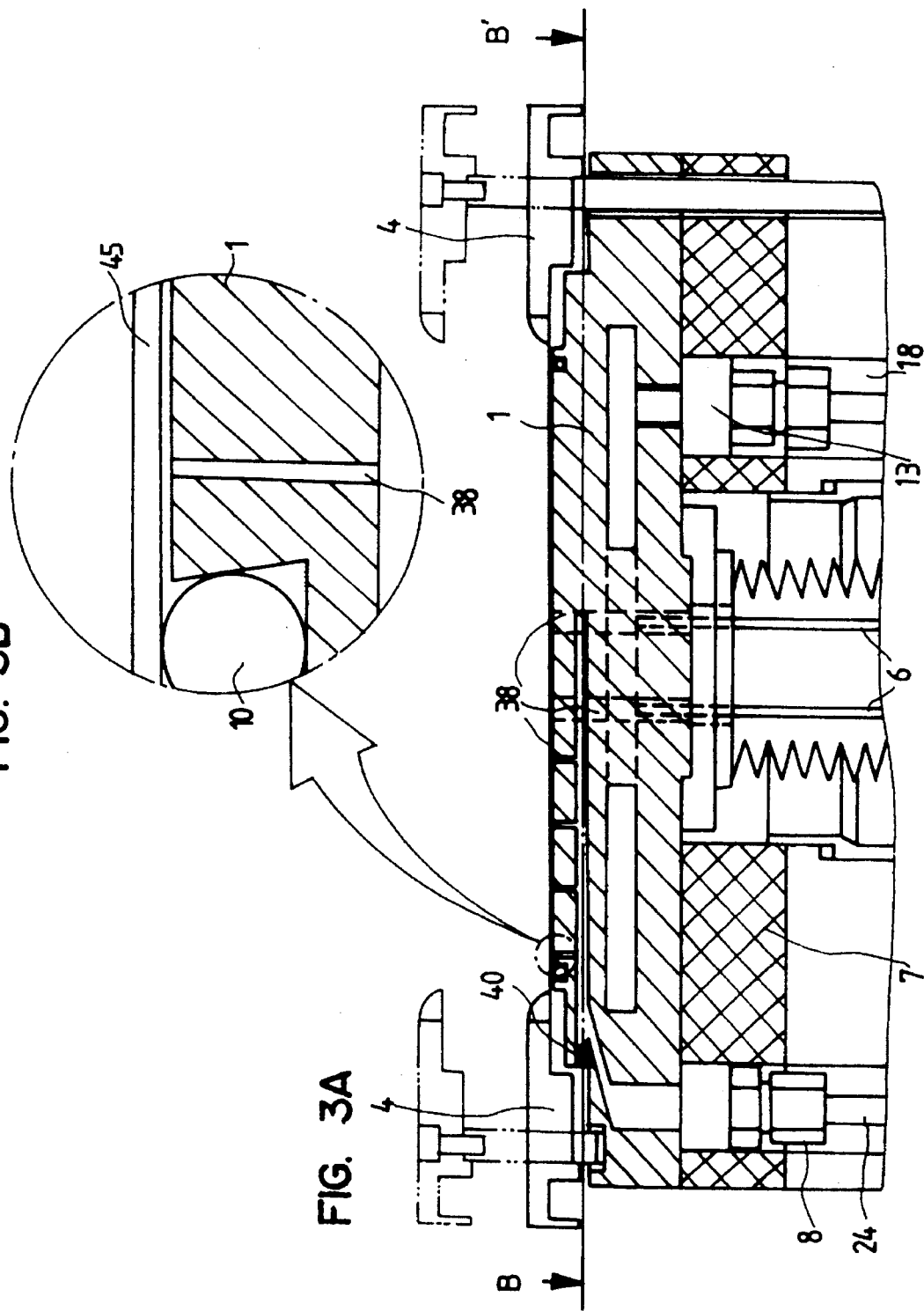
FIG. 3A is an enlarged view of a part of and FIG. 3B is an enlarged view of a part of FIG. 3A FIG. 2.

FIG. 2 is a cross-sectional view taken along the line A—A' of FIG. 1. The ECR apparatus has at the interior thereof three different chambers isolated from one another. In other words, the apparatus has a helium chamber A adapted to enhance a heat transfer contact between the wafer and the wafer pedestal, namely, the electrode, a treating chamber B adapted to perform a treatment for the wafer, and a vacuum chamber C adapted to perform a damping function for eliminating a dewing phenomenon occurring in the interior of the apparatus due to the cryogenic refrigerant forcibly circulating in the treating chamber B. The helium chamber A is the space defined between the wafer and the wafer pedestal 1 and filled with helium. The helium chamber A serves to transfer a heat from the wafer to the wafer pedestal 1. Such an operation of the helium chamber A will be described, in conjunction with FIGS. 3A and 3B.

Now, a description will be made about elements of the apparatus disposed in the three chambers.

As mentioned above, the apparatus comprises the wafer pedestal 1 for supporting a wafer thereon such that a certain film formed on the wafer can be subjected to a treatment such as etching and depositing processes by use of plasma. A refrigerant pipe 37 is arranged in the wafer pedestal 1 to provide the cooling line shown in FIG. 4 so that a cooling water can flow in the wafer pedestal 1.

The lifting pin 6 is disposed in a central hole formed at the wafer pedestal 1 and adapted to be vertically moved through the central hole. The lifting pin 6 serves to seat a wafer on the wafer pedestal 1 or lift the seated wafer from the wafer pedestal 1, so as to achieve a smooth movement of the wafer fed by a robot arm 39 of a wafer feeding system. The clamps 7 are disposed to clamp the peripheral edge of the wafer such that the wafer seated on the wafer pedestal 1 is maintained in position without any movement during the treatment thereof. When the lifting pin 6 moves vertically, the clamps 7 move correspondingly. However, the level of the clamps 7 is higher than that of the lifting pin 6 when the lifting pin 6 and the clamps 7 are upwardly moved. By such a difference in level, the robot arm 39 feeding a wafer can transfer the wafer through a space defined between the lifting pin 6 and the clamps 7 to a position over the wafer pedestal 1.

An arrangement for vertically moving the lifting pin 6 and the clamps 7 will now be described.

A vertical actuating shaft 20 is disposed beneath the lifting pin 6 to be vertically aligned with the lifting pin 6. Beneath the actuating shaft 20, a double-stroke air cylinder 28 is disposed. To the double-stroke air cylinder 28, the lower end of the actuating shaft 20 is connected. When a wafer is fed toward the wafer pedestal 1, the air cylinder 28 is actuated to lift the actuating shaft 20, thereby permitting the lifting pin 6 to receive the wafer and to lift the wafer after completion of the treatment, thereby permitting the robot arm 39 to feed the wafer to another treating station. The clamps 7 are also connected to the vertical actuating shaft 20. For connecting the clamps 7 to the vertical actuating shaft 20, a four-leg lifter 4 (indicated by a phantom line in FIG. 1) is provided which has four legs each connected at one end thereof to the vertical actuating shaft 20 and at the other end thereof each corresponding one of the clamps 7. With this construction, the clamps 7 move vertically by the vertical movement of the vertical actuating shaft 20, so as to clamp and release the wafer.

The vertical actuating shaft 20 is surrounded by bellows 16, 17 and 23. A supporting plate 31 for supporting the overall construction associated with the wafer pedestal 1 is disposed to traverse the middle portion of the vertical actuating shaft 20. On the supporting plate 31, a cylindrical supporting member 11 is supported which extends upwardly from the supporting plate 31. In the interior of the cylindrical supporting member 11, a lifting block 12 is disposed which has a passage for permitting the four-leg lifter 4 to vertically move and passages for extending a helium tube 24 and a refrigerant tube 18. A cylindrical quartz member 9 is disposed on the inner surface of the cylindrical supporting member 11.

For providing a smooth movement of the vertical actuating shaft 20, a linear guide unit 19 having a T-shaped cross-section is disposed beneath the supporting plate 31. The linear guide unit 19 is connected to the supporting plate 31 and provided with a ball bush 27. Guide bars 46 extend downwardly from the horizontal portion of the linear guide unit 19. At the lower portion of the vertical actuating shaft 20, a guide member 36 is fixedly mounted which extends to traverse the guide bars 46. The guide member 36 has guide holes through which the guide bars 46 extend. An compression coil spring 22 is disposed between the horizontal portion of the linear guide unit 19 and the guide member 36.

The compression coil spring 22 serves to downwardly move the lifted vertical actuating shaft 20 when the treating chamber is maintained in vacuum while an actuating air is vented from the air cylinder 28. The air cylinder 28 serves only to lift the vertical actuating shaft 20. Between the lower end of the vertical actuating shaft 20 and the shaft end of the air cylinder 28, a shaft cover 21 is provided for transmitting the drive power from the air cylinder 28 to the vertical actuating shaft 20.

The bellows 16 is disposed to surround a connection area between the vertical actuating shaft 20 and the lifting pin 6. The bellows 16 serves to prevent helium introduced in the helium chamber A from being leaked through the central hole of the wafer pedestal 1 along the vertical actuating shaft 20. On the other hand, the bellows 17 is disposed to surround a portion of the vertical actuating shaft 20 disposed between the four-leg lifter 4 and the supporting plate 31.

The air cylinder 28 is fixed at a desired position by means of a lower vacuum maintaining plate 26 which is supported by an outer housing 32. The bellows 23 is disposed to surround a portion of the vertical actuating shaft 20 disposed between the lower vacuum maintaining plate 26 and the supporting plate 31. At the lower end of the outer housing 32, the lower vacuum maintaining plate 26 is fixedly mounted. In the interior of the outer housing 32, the above-mentioned overall construction of the ECR apparatus is supported. The vacuum chamber C for preventing a dewing is defined between the lower vacuum maintaining plate 26 and the supporting plate 31 in the interior of the outer housing 32.

The wafer pedestal 1 has a connection with the helium tube 24 for injecting helium gas at the lower surface of the wafer and a connection with the refrigerant tube 18 for guiding the refrigerant in the wafer pedestal 1. At the connections of the wafer pedestal 1, thermal insulation members 13 and 29 are provided for preventing a heat of the wafer from being transferred to other elements through the connections. The helium tube 24 and the refrigerant tube 18 extend downwardly through the wafer pedestal 1, the supporting plate 31 and the outer housing 32. In order to apply radio frequency to a desired area, undesired areas are shielded by electrical insulation members. Such a shield construction will now be described.

Since the area to which the radio frequency is to be applied is the wafer pedestal 1, the side surface and the lower surface of the wafer pedestal 1 are shielded by insulation members in accordance with the present invention. Such insulation members are denoted by the reference numerals 3, 5, 9, 15 and 29, respectively.

In accordance with the present invention, the gas which has reacted with the wafer is exhausted through the vacuum channel 14 and then a pumping line 47. As a result, it is possible to smoothly perform the treatment.

Although the vacuum chamber C is not required to be protected by a thermal insulation member because no heat transfer medium is present in the vacuum chamber C, its portions in contact with the helium tube 24, the refrigerant tube 18 and the outer housing 32 having the treating chamber B are protected from heat by insulation members.

Now, a construction for cooling the wafer will be described, in conjunction with FIGS. 3A, 3B and 4 illustrating the upper construction of the ECR apparatus.

An annular groove is provided at the outer peripheral portion of the wafer pedestal 1. In the groove, an O-ring 10 is fitted. A wafer 45 is laid on the O-ring 10. The wafer pedestal 1 has a plurality of vertical throughout holes 38 through which helium introduced from the helium tube 24 to the wafer pedestal 1 via a tube fixture 8 reaches the lower surface of the wafer 45. A plurality of cocking members 40 are disposed at the outer edge of the annular groove so as to prevent the helium from being outwardly leaked through the outer edge of the annular groove. With this construction, the helium reaches only the lower surface of the wafer 45 along small grooves formed on the wafer pedestal 1. As shown in FIG. 4 which is a cross-sectional view taken along the line B—B' of FIG. 3A, the helium introduced in the helium line through the helium inlet 25 is radially spread in the wafer pedestal 1 and then fed to the lower surface of the wafer 45 through the vertical throughout holes 38. The O-ring 10 serves to reduce a leakage of the helium gas into the treating chamber as much as possible. The annular groove of the wafer pedestal 1 has a trapezoid shape so as to prevent the O-ring 10 from be separated from the annlar groove due to a shrinkage of the wafer being cryogenically treated. As shown in FIG. 4, the helium is introduced in the wafer pedestal 1 through the tube fixture 8 and then circulated in the wafer pedestal 1. In the drawings, no refrigerant outlet is shown.

FIG. 5 shows a refrigerant line along which the refrigerant supplied through the refrigerant tube 18 is circulated, the helium inlet 25 and a radio frequency terminal 35.

Now, operation of the ECR apparatus having the above-mentioned construction will be described.

When a wafer is fed to a position where the wafer is disposed above the wafer pedestal 1, the vertical actuating shaft 20 is vertically moved by an operation of the air cylinder 28 having a double stroke, namely, a primary stroke of 25 mm and a secondary stroke of 10 mm. By the vertical movement of the vertical actuating shaft 20, the four-leg lifter 4 and the cylindrical quartz member 9 are vertically moved. Accordingly, a vertical drive force is transmitted to the clamps 7, thereby causing the clamps 7 to vertically move.

Before the wafer is introduced in the ECR apparatus by the wafer feeding device, the vertical actuating shaft 20 moves upwardly by a length (about 25 mm) corresponding to the primary stroke of the air cylinder 28, thereby forming a passage for receiving the wafer.

After completion of the above operation, the wafer is horizontally and centrally maintained in the treating chamber by the wafer feeding device. At this time, the secondary stroke of the air cylinder 28 causes the lifting pin 6 positioned in the central hole of the wafer pedestal 1 to be lifted. As a result, the lifting pin 6 receives the wafer from the wafer feeding device.

Thus, the wafer fed from an external source can be seated on the wafer pedestal 1 disposed in the treating chamber. After completion of the treatment, the wafer is taken out of the treating chamber in a manner reverse to the above-mentioned manner.

In the interior of the wafer pedestal 1 on which the wafer is laid, a refrigerant of −90° C. is repeatedly forcibly circulated through the refrigerant tube 18, thereby reducing the temperature of the wafer fed at a room temperature to the same temperature as that of the refrigerant within several minutes.

Since a heat transfer effect is hardly generated between the wafer and the wafer pedestal 1 when the treating chamber is maintained at a vacuum state, a small space is provided between the wafer pedestal 1 and the wafer in accordance with the present invention. In the small space, helium exhibiting a superior heat transfer characteristic (refer to Table 1) is filled so as to promote a heat circulation. The helium is uniformly spread over the wafer pedestal 1 through the helium line having line portions radially extending from the helium tube 24 along the wafer pedestal 1. Accordingly, the helium is diffused in the small space defined between the wafer pedestal 1 and the wafer.

An isolated space is defined at the lower portion of the ECR apparatus to provide the vacuum chamber C in which a vacuum is maintained for avoiding a dewing phenomenon that moisture contained in air is dewed due to a decrease in ambient temperature caused by the cryogenic refrigerant.

In accordance with the present invention, an SP polyimide resin exhibiting a superior thermal insulation effect is used to prevent the cooling line from coming into contact with other metal elements, thereby minimizing a heat loss generated at areas where the refrigerant entering the vacuum chamber C comes into contact with the metal elements. In Table 1, heat transfer coefficients of various mediums are indicated.

TABLE 1

Heat Transfer Coefficients of Various Mediums k (W/m °C.)

| Gaseous Medium | Heat Transfer Coefficient (k) at −73° C. |
| --- | --- |
| Air | 0.01809 |
| Helium | 0.1177 |
| $CO_2$ | 0.010805 |
| Hydrogen | 0.1282 |
| Oxygen | 0.01824 |

| Solid Medium | Heat Transfer Coefficient (k) |
| --- | --- |
| Aluminum | 215 (−100° C.) |
| SP Polyimide Resin | 0.343 (40° C.) |

Consequently, the ECR apparatus of the present invention can obtain a higher electron density than those of the conventional RIE equipments by about 100 times at a low gas pressure corresponding to 1/100 of the gas pressure used in the conventional RIE equipments. As a result, a desired etch rate can be obtained even when a bias voltage applied to substrates is reduced by several tens volts In the ECR apparatus of the present invention, accordingly, the electrode on which a wafer is laid can be maintained at a cryogenic temperature, for example, −90° C., thereby enabling the activity of radicals to be minimized. As a result, an improvement in anisotropy is achieved. It is also possible to maximize the activity of ions having a directivity and thus obtain a desired etch rate irrespective of the anisotropy. These effects will be described in detail.

In etching utilizing ions and radicals, the radicals can not be externally controlled because of its non-polarity characteristic, even though the ions moves with a directivity because of its polarity characteristic. In order to prevent an etch of a vertical wall of a wafer due to the radicals, the activity of the radicals is reduced by decreasing the temperature of the radicals to the cryogenic temperature in accordance with the present invention. By virtue of such a reduction in activity of radicals, it is possible to obtain a satisfactory vertical wall and a satisfactory etch rate.

Figure 6A:
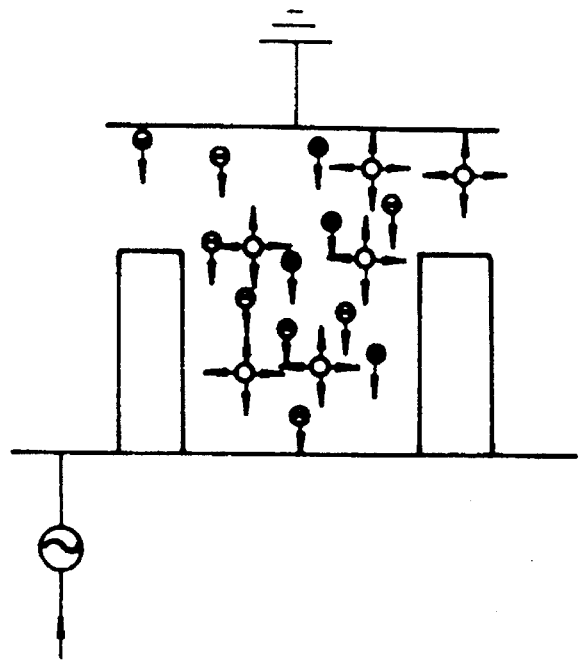
FIGS. 6a and 6b are schematic views explaining an operation of the ECR apparatus of the present invention and an effect obtained by the operation.
Figure 6B:
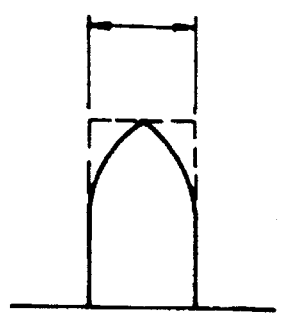

In accordance with the present invention, a bias voltage applied region is limited to the wafer so that active seeds including ions and electrons can be uniformly dropped on the wafer, as shown in FIG. 6A. Accordingly, there is no problem of an instability of plasma.

This enables an ideal dry etch required for fabrication of semiconductor devices having a next generation integrated micropattern of 16M-grade and 64M-grade or above.

By a radioactive motion property of radicals, a side wall fabrication of next generation integrated micropatterns in accordance with the present invention. It is also possible to eliminate conflicting increase/decrease phenomenons occurring between the etch rate and the anistropy and between the etch rate and the uniformity in general etching equipments. This achieves not only a desired vertical etch, but also a rapid etch rate. As a result, it is possible to eliminate factors of causing a complexity in the process using a conventional triple-layer photoresist (TLR) or multilayer photoresist (MTR) and degrading the yield and the productivity.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electron cyclotron resonance apparatus having a coolant circulation line in a wafer pedestal, the coolant circulation line for conveying coolant to absorb heat transferred from a wafer laid on the wafer pedestal to the wafer pedestal, the apparatus comprising:

a process chamber for performing a treatment to the wafer;

a heat transfer chamber for injecting a heat transfer gas into a backside of the wafer to enhance a heat transfer contact area between the wafer and the wafer pedestal;

a vacuum chamber for eliminating a dewing phenomenon occurring in an interior of the apparatus due to injection of cryogenic refrigerant into said process chamber and due to injection of coolant into the wafer pedestal, the vacuum chamber being an isolated space and being configured for maintaining a vacuum within said isolated space, wherein the vacuum chamber is not connected to any means for introducing a dry gas; and lifting means for vertically lifting the wafer on the wafer pedestal, said lifting means extending through said process chamber, heat transfer chamber, and vacuum chamber.

2. An electron cyclotron resonance apparatus in accordance with claim 1, wherein said lifting means comprises:

a double-stroke cylinder for generating a vertical drive force;

a lifting pin vertically extending through said wafer pedestal to be vertically moved, said lifting means being arranged to vertically lift the wafer laid on said wafer pedestal;

a vertical actuating shaft operatively connected to said cylinder and arranged to transmit said vertical drive force of the cylinder to the lifting pin, said vertical actuating shaft being moved by the vertical drive force from the cylinder;

a lifter fixedly mounted to said vertical actuating shaft to be vertically moved by said vertical movement of the vertical actuating shaft, said lifter having at least one leg;

at least one clamp fixedly mounted to a free end of said at least one leg of the lifter and arranged to clamp a peripheral edge of the wafer so that the wafer is continuously held in position without any movement during treatment of the wafer;

a supporting plate disposed to traverse a portion of the vertical actuating shaft disposed beneath the lifter and arranged to support the wafer pedestal;

a linear guide unit arranged to guide the vertical movement of the vertical actuating shaft, said linear guide unit being integral with said supporting plate and having a T-shape including a horizontal portion and a vertical portion;

at least one guide bar downwardly extending from the linear guide unit;

a guide member fixedly mounted to the vertical actuating shaft beneath the linear guide unit to traverse said guide bar, said guide member having a guide hole through which the guide bar extends; and a spring disposed between said horizontal portion of the linear guide unit and the guide member and arranged to downwardly move the vertical actuating shaft.

3. An electron cyclotron resonance apparatus in accordance with claim 2, wherein said vertical actuating shaft is surrounded by bellows arranged to prevent leakage of said refrigerant along the vertical actuating shaft.

4. An electron cyclotron resonance apparatus in accordance with claim 1, wherein said wafer pedestal has a gas line for guiding said heat transfer gas and a plurality of holes throughout in communication with said gas line and arranged to guide said heat transfer gas from the gas line to a region defined beneath said wafer.

5. An electron cyclotron resonance apparatus in accordance with claim 1, further comprising an O-ring disposed on said wafer pedestal and arranged to support said wafer so as to minimize contact between the wafer pedestal and the wafer and prevent said heat transfer gas from being leaked out of a treating chamber defined between an upper surface of the wafer pedestal and a lower surface of the wafer.

6. An electron cyclotron resonance apparatus in accordance with claim 1, further comprising thermal insulating members surrounding said heat transfer gas tube except for a portion of the heat transfer gas tube in contact with said wafer pedestal.

7. An electron cyclotron resonance apparatus in accordance with claim 2, further comprising a shaft cover provided at a connection area between said vertical actuating shaft and said cylinder.

8. An electron cyclotron resonance apparatus in accordance with claim 2, wherein said linear guide unit has a ball bush arranged to accurately guide the vertical movement of said vertical actuating shaft.

9. An electron cyclotron resonance apparatus in accordance with claim 4, wherein said gas line has a plurality of radially extending line portions formed in said wafer pedestal in communication with said holes.

10. An electron cyclotron resonance apparatus in accordance with claim 5, wherein said wafer pedestal has a trapezoidal annular groove for receiving said O-ring.

* * * * *